(12) United States Patent
Yoshinaga

(10) Patent No.: US 12,464,681 B2
(45) Date of Patent: Nov. 4, 2025

(54) ELECTRONIC DEVICE AND ELECTRONIC DEVICE MANUFACTURING METHOD

(71) Applicant: HITACHI ASTEMO, LTD., Hitachinaka (JP)

(72) Inventor: Kumiko Yoshinaga, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 215 days.

(21) Appl. No.: 18/043,640

(22) PCT Filed: Jun. 1, 2021

(86) PCT No.: PCT/JP2021/020807
§ 371 (c)(1),
(2) Date: Mar. 1, 2023

(87) PCT Pub. No.: WO2022/102149
PCT Pub. Date: May 19, 2022

(65) Prior Publication Data
US 2023/0269913 A1 Aug. 24, 2023

(30) Foreign Application Priority Data
Nov. 13, 2020 (JP) .................. 2020-189061

(51) Int. Cl.
*H05K 7/20* (2006.01)
*G06F 1/20* (2006.01)

(52) U.S. Cl.
CPC ........... *H05K 7/20454* (2013.01); *G06F 1/20* (2013.01)

(58) Field of Classification Search
CPC .. G06F 1/20; H05K 7/20436; H05K 7/20454; F24F 1/20
(Continued)

(56) References Cited

U.S. PATENT DOCUMENTS 6,785,137 B2 * 8/2004 Siegel ................. H01L 23/3121
257/E23.101
2019/0304869 A1 * 10/2019 Larson ................. H01L 23/4093

FOREIGN PATENT DOCUMENTS

CN 110867426 A * 3/2020 ............... G06F 1/20
JP 2008016653 A * 1/2008 ........... H01L 21/563
(Continued)

OTHER PUBLICATIONS

Arctic Silver 5 Features, Oct. 19, 2003 (Wayback Machine Capture Date), Arctic Silver Incorporated, p. 1 (Year: 2003).*
(Continued)

*Primary Examiner* — Mandeep S Buttar
*Assistant Examiner* — Kyle Oxenknecht
(74) *Attorney, Agent, or Firm* — FOLEY & LARDNER LLP

(57) ABSTRACT

An electronic device and an electronic device manufacturing method according to the present invention include, as a mode thereof, a substrate on which an element that produces heat, which is rectangular, is mounted, a radiator member disposed at a position facing the element that produces heat, and a heat conductive material filling a gap between the element that produces heat and the radiator member. The radiator member includes a rectangular frame that surrounds an arrangement region of the heat conductive material in a position of a surface facing the element that produces heat outside a peripheral edge of the element that produces heat, and has a cutout in at least one of four corners of the frame. With this configuration, when assembling the substrate onto the radiator member, excess heat conductive material flows out of the frame from the cutout.

6 Claims, 13 Drawing Sheets

(58) Field of Classification Search
USPC .......................................................... 361/704
See application file for complete search history.

(56) References Cited

FOREIGN PATENT DOCUMENTS

| JP | 2012015372 A | * | 1/2012 | ............. H01L 23/36 |
| JP | 5382049 B2 | * | 1/2014 | ......... H01L 23/3672 |
| JP | 2017-162860 A | | 9/2017 | |
| JP | 2018198335 A | * | 12/2018 | ......... H01L 23/3675 |

OTHER PUBLICATIONS

International Search Report dated Aug. 10, 2021 issued in International Application No. PCT/JP2021/020807, with English translation, 5 pages.
International Preliminary Report on Patentability dated May 19, 2023 issued in International Application No. PCT/JP2021/020807, 4 pages.

* cited by examiner

ELECTRONIC DEVICE AND ELECTRONIC DEVICE MANUFACTURING METHOD

TECHNICAL FIELD

The present invention relates to an electronic device having a substrate on which an element that produces heat is mounted, and relates to a method for manufacturing the electronic device.

BACKGROUND ART

An electronic control device disclosed in Patent Document 1 includes: a substrate; an electronic component having an array of solder balls electrically connected to the substrate; a case having a radiator base facing the electronic component; and a heat conductive material disposed between the electronic component and the radiator base. The electronic control device is characterized in that the heat conductive material is omitted from at least one corner of a first surface of the electronic component on the radiator base side.

REFERENCE DOCUMENT LIST

Patent Document

Patent Document 1: JP 2017-162860 A

SUMMARY OF THE INVENTION

Problem to be Solved by the Invention

In an electronic device having a substrate on which an element that produces heat such as a BGA-package microcomputer is mounted and in which a gap between the element that produces heat and a radiator member is filled with a heat conductive material, a heat dissipation grease is used as the heat conductive material, for example.

Note that the radiator member described above is a part of a radiator base provided in a case.

In such an electronic device, after applying the heat dissipation grease on the radiator member, the substrate on which the element that produces heat is mounted is assembled onto the radiator member to fill the gap between the element that produces heat and the radiator member with the heat dissipation grease.

Here, when the substrate is assembled onto the radiator member, in some cases, the heat dissipation grease is spread out and overflows from the region of the element that produces heat.

Then, when the heat dissipation grease, having overflowed from the region of the element that produces heat, adheres to an electrode of the element that produces heat, the distortion amount of the electrode increases and may reduce the reliability of electrical connection between the substrate and the element that produces heat.

The present invention has been made in view of the foregoing, and aims to provide an electronic device that can curb adhesion of a heat dissipation grease to an electrode of an element that produces heat, and a method for manufacturing the electronic device.

Means for Solving the Problem

According to an electronic device according to the present invention, in one mode thereof, the electronic device includes a curable heat dissipation grease filling a gap between an element that produces heat and a radiator member. The radiator member includes a rectangular frame that surrounds an arrangement region of the heat dissipation grease in a position of a surface facing the element that produces heat outside a peripheral edge of the element that produces heat, and has a cutout in at least one of four corners of the frame. A pooling part of the heat dissipation grease having a lower bottom surface, which is lower than the region surrounded by the frame, is provided outside the cutout.

Additionally, according to an electronic device manufacturing method according to the present invention, in one mode thereof, the method includes a first step of applying the heat dissipation grease in a semi-liquid form on a part of the radiator member surrounded by the frame, and a second step of fastening the substrate onto the radiator member with a screw and spreading out the heat dissipation grease sandwiched between the radiator member and the element that produces heat.

Effects of the Invention

According to the present invention, it is possible to curb adhesion of a heat dissipation grease to an electrode of an element that produces heat.

MODE FOR CARRYING OUT THE INVENTION

Hereinafter, embodiments of an electronic device and an electronic device manufacturing method according to the present invention will be described with reference to the drawings.

Figure 1:
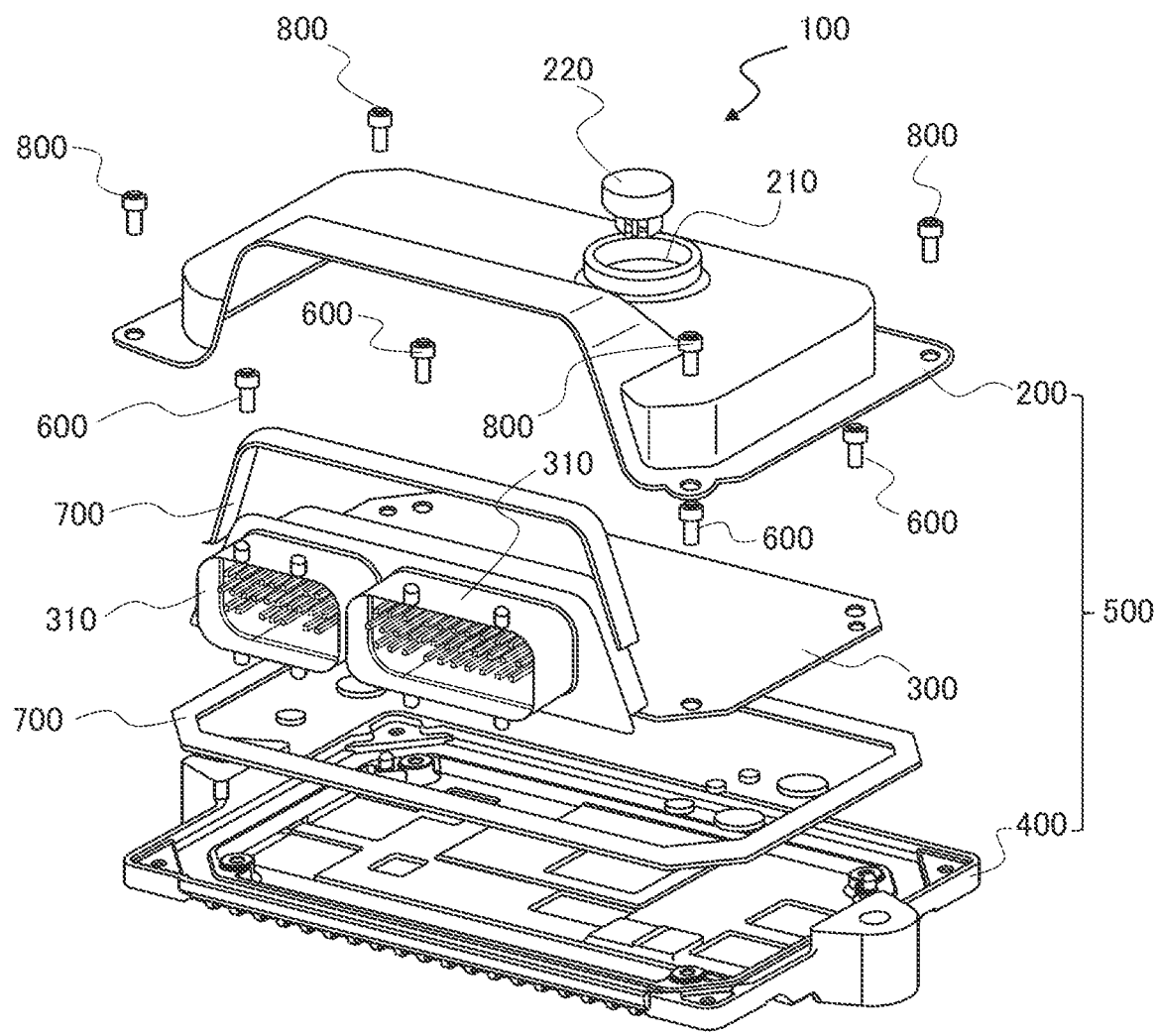
FIG. 1 is an exploded perspective view of an electronic device.

FIG. 1 is an exploded perspective view illustrating a mode of an electronic device 100.

Electronic device 100 is an electronic control device including a microcomputer that controls an internal combustion engine, an automatic transmission, and the like mounted on an automobile, for example.

Electronic device 100 includes a cover 200, a substrate 300, and a base 400.

Cover 200 and base 400 are formed of a metal material with high thermal conductivity such as aluminum, and cover 200 and base 400 form a case 500 that accommodates substrate 300.

Substrate 300 includes connectors 310, and is fastened to base 400 with a plurality of screws 600.

Cover 200 and base 400 are assembled with a waterproof seal member 700 interposed between bond surfaces thereof and are fastened with a plurality of screws 800.

Cover 200 includes an air vent 210 that allows ventilation between the inside and outside of case 500, and a filter 220 is attached to air vent 210.

Next, steps of assembly of electronic device 100 will be described schematically with reference to FIGS. 2 to 5.

As will be described later, electronic device 100 has a radiating structure in which heat of an element that produces heat and is mounted on substrate 300 is dissipated via a radiator base provided in base 400, and a heat dissipation grease is used as a heat conductive material filling a gap between the element that produces heat and the radiator base.

Figure 2:
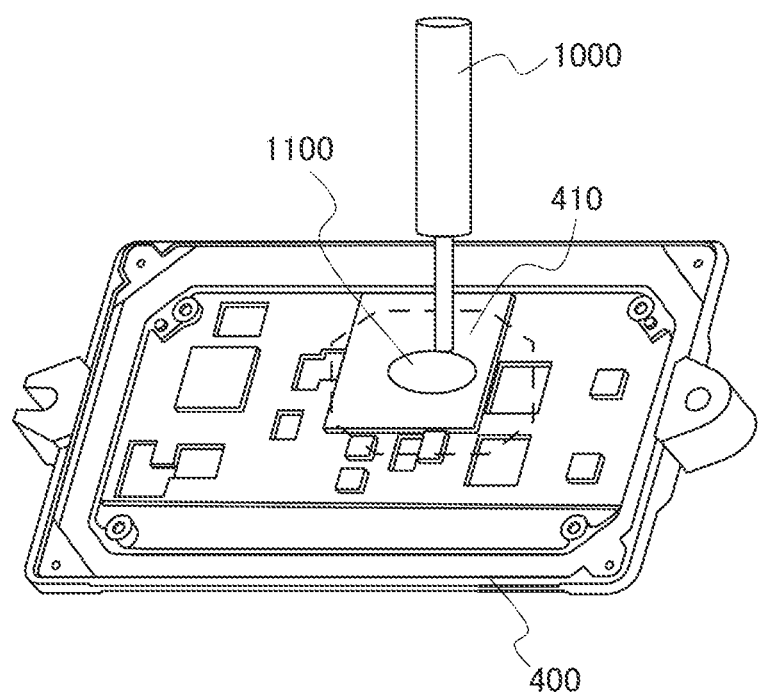
FIG. 2 is a diagram illustrating a first step of assembly of the electronic device.

FIG. 2 illustrates a heat dissipation grease application step as a first step.

In the first step, a heat dissipation grease 1100 is applied, by using an application nozzle 1000, on a radiator base 410 as a radiator member provided in a recessed shape on an inner surface of base 400.

An example of heat dissipation grease 1100 is a heat dissipation grease that cures after assembly, that is, a curable heat dissipation grease in which a metal with high thermal conductivity or metal oxide particles are mixed with a grease of modified silicone or the like as a base.

Note that in order to dissipate heat of an element that produces heat and is mounted on substrate 300 via base 400, radiator base 410 is formed in accordance with the position and shape of the element that produces heat.

Figure 3:
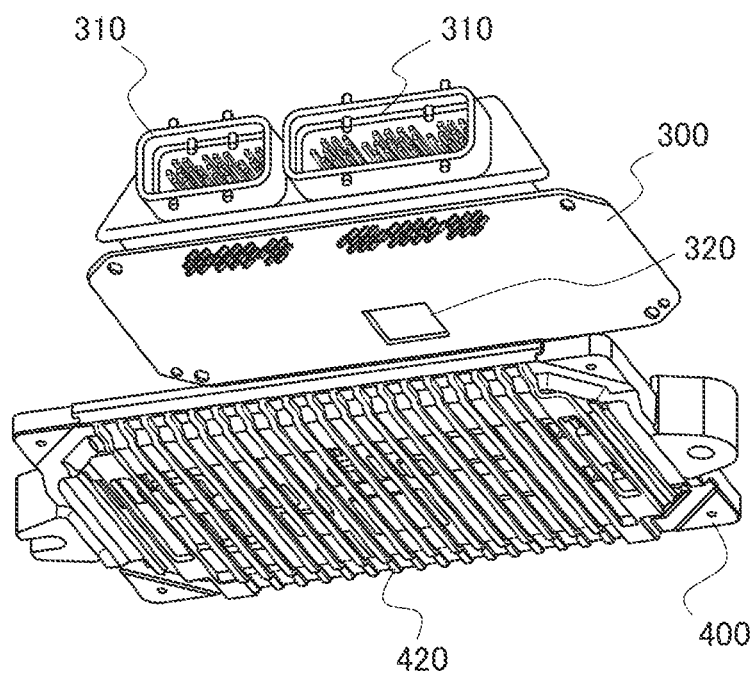
FIG. 3 is a perspective view of a substrate and a base of the electronic device.

FIG. 3 illustrates a microcomputer 320, as an element that produces heat, mounted on substrate 300 and the outer shape of base 400.

Microcomputer 320 as a rectangular element that produces heat is mounted on a surface of substrate 300 that faces radiator base 410.

Microcomputer 320 is a microcomputer that adopts a BGA (ball grid array) package in which ball-shaped electrodes are arranged on a rectangular resin package, for example.

Additionally, a plurality of radiator fins 420 is formed integrally with an outer surface of base 400.

Figure 4:
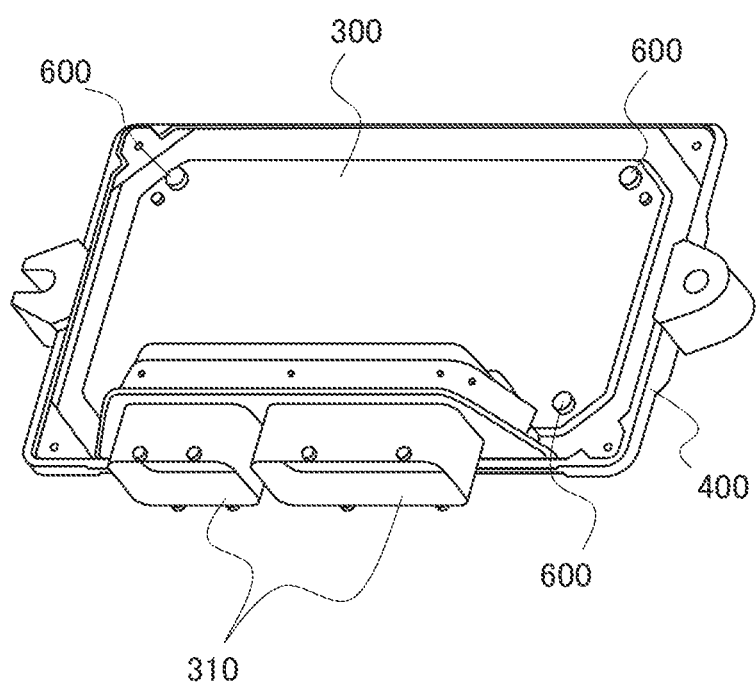
FIG. 4 is a diagram illustrating a second step of the assembly of the electronic device.

FIG. 4 illustrates a substrate 300 assembly step as a second step.

In the second step, substrate 300 is fastened, with screws 600, to base 400 in which semi-liquid heat dissipation grease 1100 is applied on radiator base 410.

Here, heat dissipation grease 1100 applied on radiator base 410 is sandwiched between radiator base 410 and microcomputer 320 and is spread out, so that heat dissipation grease 1100 fills a gap between radiator base 410 and microcomputer 320.

Figure 5:
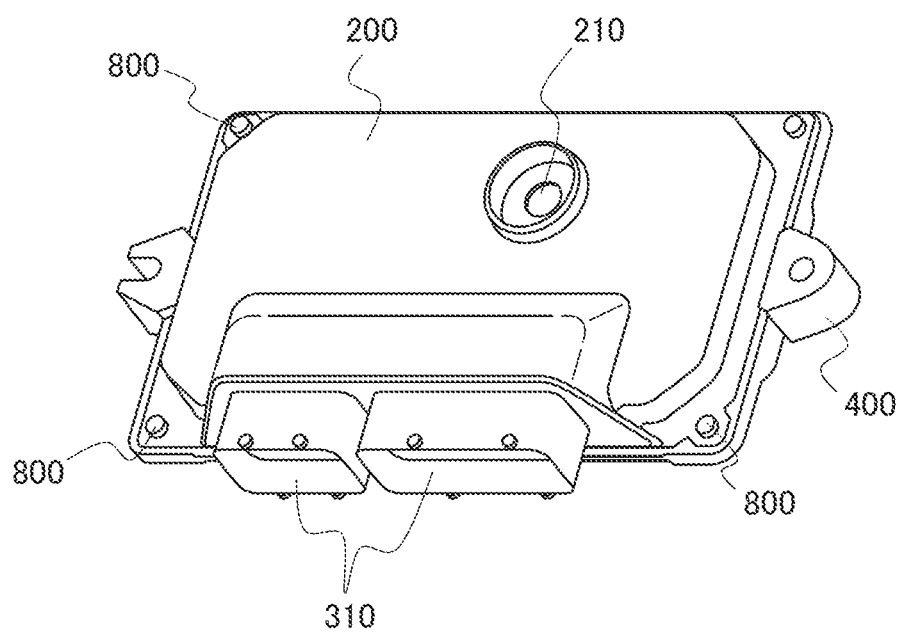
FIG. 5 is a diagram illustrating a third step of the assembly of the electronic device.

FIG. 5 illustrates a step of assembly of base 400 and cover 200 as a third step.

In the third step, electronic device 100 is assembled by assembling cover 200 onto base 400 to which substrate 300 is fastened with waterproof seal member 700 interposed between bonding surfaces, and fastening with a plurality of screws 800.

In the application of heat dissipation grease 1100 in the first step described above, it is difficult to manage the application weight of heat dissipation grease 1100 with high accuracy, and there is a possibility that heat dissipation grease 1100 may overflow from radiator base 410 and adhere to an electrode of microcomputer 320.

Then, when heat dissipation grease 1100 adheres to the electrode, the distortion amount of the electrode increases and may reduce the reliability of electric connection between substrate 300 and microcomputer 320.

Against this background, in electronic device 100, the shape of radiator base 410 is modified as a measure to avoid adhesion of heat dissipation grease 1100 to the electrode of microcomputer 320.

Figure 6:
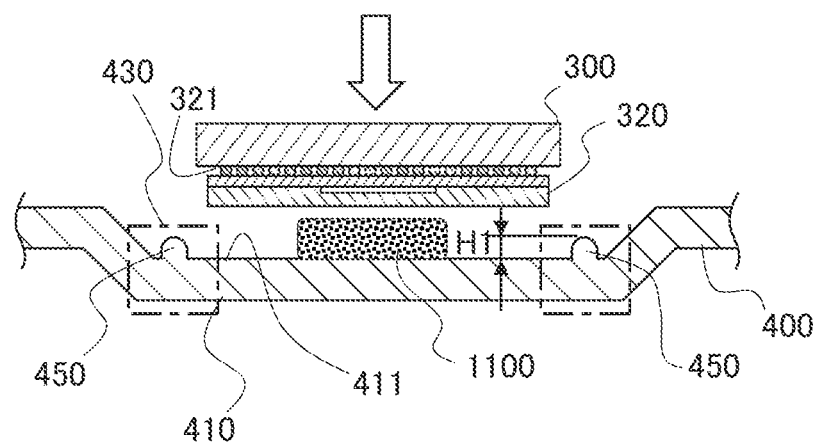
FIG. 6 is a cross-sectional view of a radiator base and a substrate illustrating a first mode of a measure for avoiding adhesion.
Figure 7:
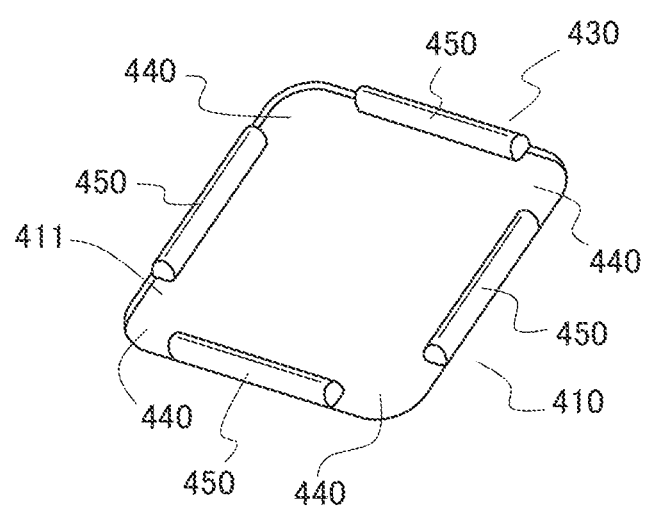
FIG. 7 is a perspective view of the radiator base in the first mode.
Figure 8:
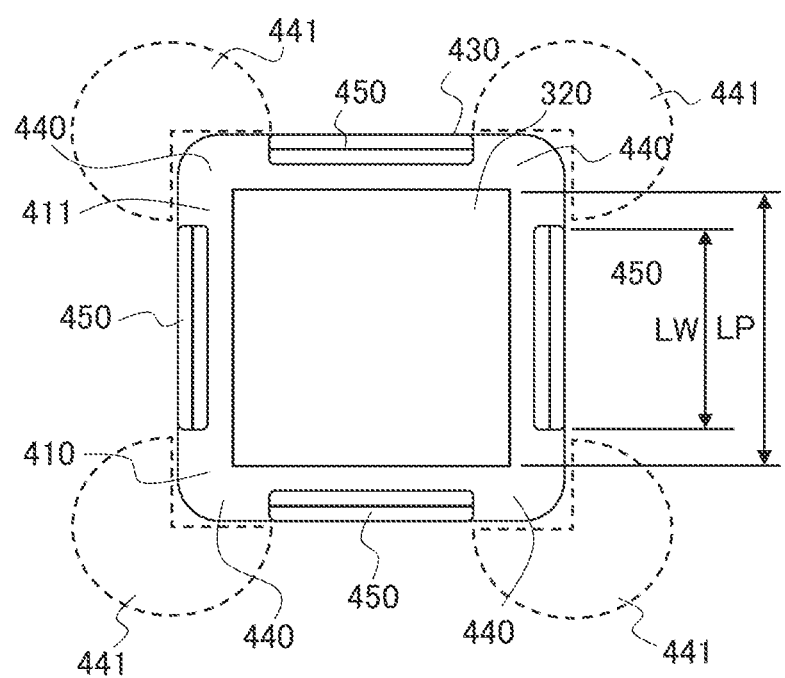
FIG. 8 is a top view of the radiator base in the first mode.

FIGS. 6 to 8 illustrate a first mode of the measure for avoiding adhesion.

FIG. 6 is a cross-sectional view of radiator base 410 and substrate 300 in the process of assembling substrate 300 onto base 400, FIG. 7 is a perspective view of radiator base 410, and FIG. 8 is a top view of radiator base 410.

In the first mode of the measure for avoiding adhesion illustrated in FIGS. 6 to 8, at a position of a bottom surface 411 of radiator base 410 facing microcomputer 320 outside the peripheral edge of microcomputer 320, a rectangular frame 430 surrounding the arrangement region of heat dissipation grease 1100 is formed in a wall shape with a height H1 protruding from bottom surface 411, and cutouts 440 where an upper part of the wall is cut to reduce the height from H1 (specifically, the wall is removed) are formed in the four corners of frame 430.

Note that the structure is not limited to forming cutout 440 in all four corners of frame 430, and cutout 440 may be formed in at least one of the four corners of frame 430.

For example, cutout 440 may be formed in two diagonally opposite corners of the four corners of frame 430, cutout 440 may be formed in two corners at both ends of one side of frame 430, or cutout 440 may be formed in three of the four corners of frame 430.

Here, a length LW of one side of frame 430 excluding cutouts 440, that is, length LW of wall 450 with height H1 is set shorter than a length LP of one side of the package of microcomputer 320 facing wall 450.

In other words, wall 450 with length LW shorter than length LP of one side of the package of microcomputer 320 facing wall 450 is erected at positions of bottom surface 411 of radiator base 410 outside the four sides of microcomputer 320, so that the four walls 450 surround the arrangement region of heat dissipation grease 1100 in a rectangular shape.

Then, cutout 440 where walls 450 are interrupted functions as a release opening that allows heat dissipation grease 1100 to flow out from the inside of frame 430.

Moreover, a storage part 441 that can store heat dissipation grease 1100 having flowed out of a region surrounded by frame 430 is provided outside cutout 440. In other words, a space that allows inflow of heat dissipation grease 1100 having flowed out from cutout 440 is ensured outside cutout 440.

According to such a measure for avoiding adhesion, when heat dissipation grease 1100 is spread out by substrate 300, spreading of heat dissipation grease 1100 toward the four sides from the center of the package of microcomputer 320 is restricted by walls 450 forming frame 430.

In addition, excess heat dissipation grease 1100, that is, heat dissipation grease 1100 exceeding the amount that fills the gap between microcomputer 320 and radiator base 410 is guided by walls 450 to flow toward cutouts 440 at the four corners, and flows out to the outside of frame 430 from cutouts 440 at the four corners to be stored in storage parts 441.

Here, since length LW of wall 450 is made shorter than length LP of the package of microcomputer 320, excess heat dissipation grease 1100 can flow out smoothly from cutout 440 while keeping heat dissipation grease 1100 away from an electrode 321 of microcomputer 320.

As a result, since heat dissipation grease 1100 can be kept away from electrode 321 of microcomputer 320, adhesion of heat dissipation grease 1100 to electrode 321 of microcomputer 320 can be avoided, and the reliability of electrical connection between substrate 300 and microcomputer 320 can be improved.

Additionally, since heat dissipation grease 1100 can be spread out substantially equally when fastening substrate 300 onto base 400 on which heat dissipation grease 1100 is applied and curb unevenness of heat dissipation grease 1100, high radiation property can be ensured.

Figure 9:
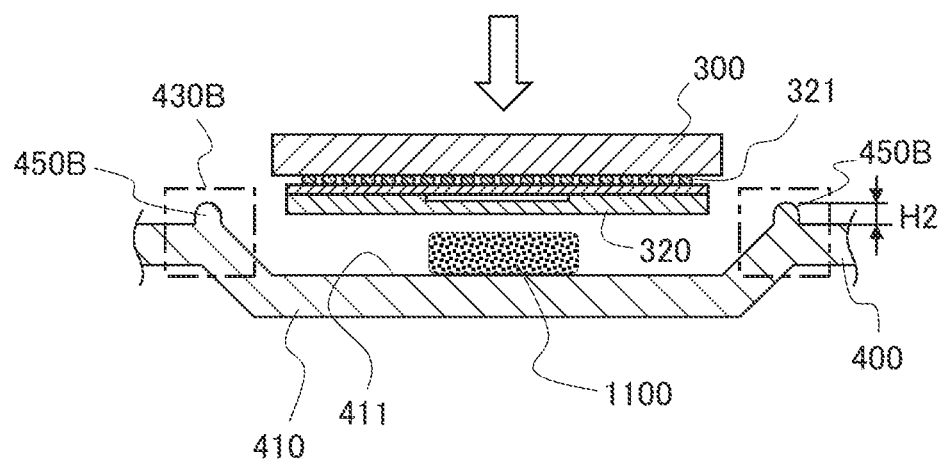
FIG. 9 is a cross-sectional view of a radiator base and a substrate illustrating a second mode of the measure for avoiding adhesion.
Figure 10:
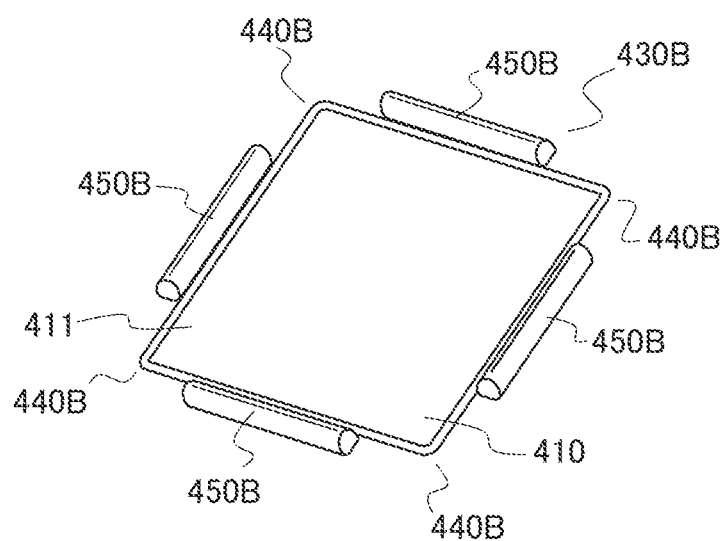
FIG. 10 is a perspective view of the radiator base in the second mode.
Figure 11:
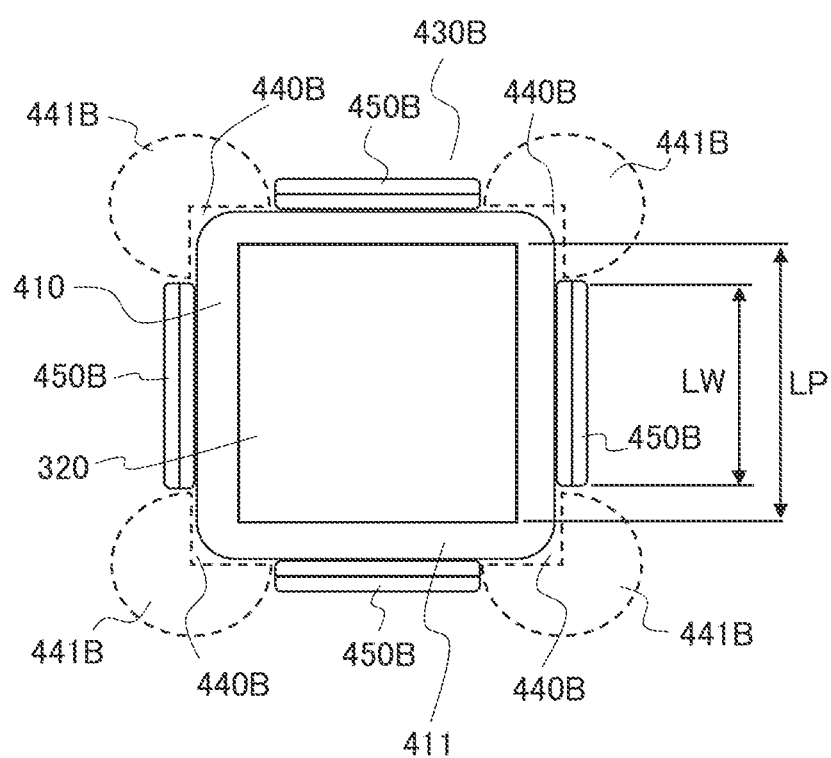
FIG. 11 is a top view of the radiator base in the second mode.

FIGS. 9 to 11 illustrate a second mode of the measure for avoiding adhering.

FIG. 9 is a cross-sectional view of radiator base 410 and substrate 300 in the process of assembling substrate 300 onto base 400, FIG. 10 is a perspective view of radiator base 410, and FIG. 11 is a top view of radiator base 410.

In the second mode of the measure for avoiding adhesion illustrated in FIGS. 9 to 11, at a position outside the peripheral edge of microcomputer 320 and a step higher than the periphery of recessed radiator base 410, a rectangular frame 430B surrounding the arrangement region of heat dissipation grease 1100 is formed in a wall shape protruding at a height H2, and cutouts 440B where an upper part of the wall is cut to reduce the height from H2 (specifically, the wall is removed) are formed in the four corners of frame 430B.

In this mode, too, a length LW of one side of frame 430B excluding cutouts 440B, that is, length LW of wall 450B with height H2 is set shorter than a length LP of one side of the package of microcomputer 320 facing wall 450B.

In other words, in the second mode, wall 450B with length LW shorter than length LP of one side of the package of microcomputer 320 facing wall 450B is erected at positions outside the peripheral edge of microcomputer 320 and a step higher than the periphery of recessed radiator base 410, so that the four walls 450B surround the arrangement region of heat dissipation grease 1100 in a rectangular shape.

Then, cutout 440B where walls 450B are interrupted functions as a release opening that allows heat dissipation grease 1100 to flow out from the inside of frame 430.

Moreover, a storage part 441B that can store heat dissipation grease 1100 having flowed out of a region surrounded by frame 430B is provided outside cutout 440B. In other words, a space that allows inflow of heat dissipation grease 1100 having flowed out from cutout 440B is ensured outside cutout 440B.

According to such a second mode of the measure for avoiding adhesion, too, adhesion of heat dissipation grease 1100 to electrode 321 of microcomputer 320 can be avoided, and the reliability of electric connection between substrate 300 and microcomputer 320 can be improved.

Additionally, since heat dissipation grease 1100 can be spread out substantially, equally when fastening substrate 300 onto base 400 on which heat dissipation grease 1100 is applied and curb unevenness of heat dissipation grease 1100, high radiation property can be ensured.

Figure 12:
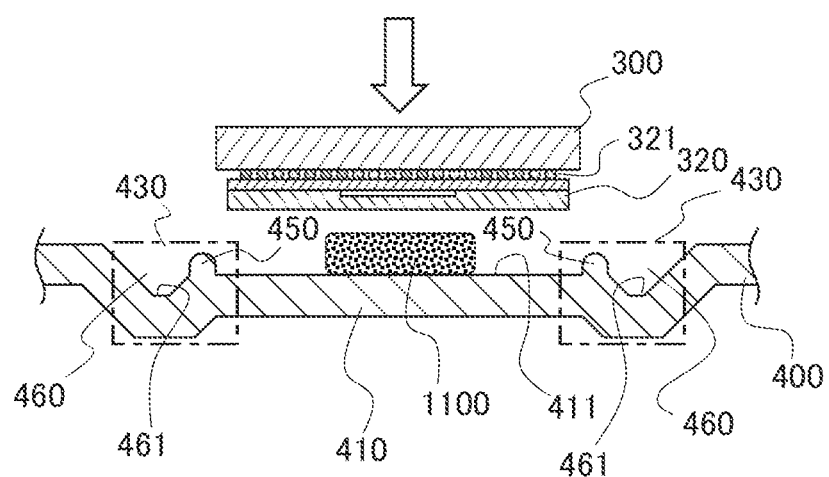
FIG. 12 is a cross-sectional view of a radiator base and a substrate illustrating a third mode of the measure for avoiding adhesion.
Figure 13:
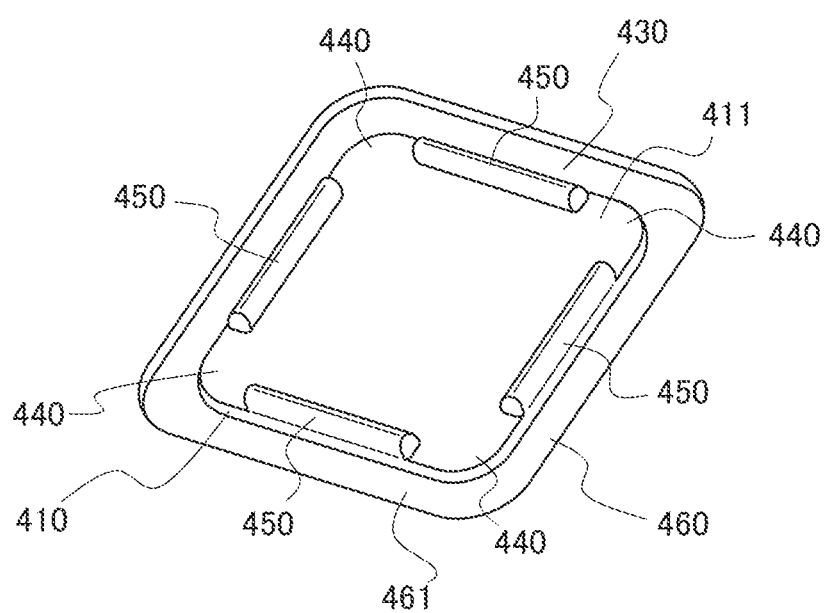
FIG. 13 is a perspective view of the radiator base in the third mode.

FIGS. 12 and 13 illustrate a third mode of the measure for avoiding adhesion.

FIG. 12 is a cross-sectional view of radiator base 410 and substrate 300 in the process of assembling substrate 300 onto base 400, and FIG. 13 is a perspective view of radiator base 410.

In the third mode of the measure for avoiding adhesion illustrated in FIGS. 11 and 12, similarly to the first mode, at a position of bottom surface 411 of radiator base 410 facing microcomputer 320 outside the peripheral edge of microcomputer 320, rectangular frame 430 surrounding the filling region of heat dissipation grease 1100 is formed in a wall shape with height H1 protruding from bottom surface 411, and cutouts 440 where an upper part of the wall is cut to reduce the height from H1 are formed in the four corners of frame 430.

Moreover, an annular groove 460 surrounding the outside of frame 430 is formed, and a bottom surface 461 of groove 460 is made lower than bottom surface 411 of radiator base 410.

Groove 460 described above forms, outside cutout 440, a pooling part for pooling heat dissipation grease 1100 that flows out from the inside of frame 430.

According to such a third mode of the measure for avoiding adhesion, heat dissipation grease 1100 having flowed to the outside of frame 430 via cutout 440 can be retained inside groove 460, and the effect of curbing adhesion of heat dissipation grease 1100 to electrode 321 of microcomputer 320 can be enhanced even more.

The technical ideas described in the above embodiments can be combined appropriately as long as they do not conflict with each other.

Additionally, while the contents of the present invention have been described specifically with reference to favorable embodiments, it is clear that a person skilled in the art would be able to conceive of various modifications according to the basic technical ideas and teachings of the present invention.

For example, the element that produces heat is not limited to a microcomputer, and the radiating structure according to the invention of the present application is applicable to an element that produces heat such as a power supply circuit.

Additionally, while annular groove 460 surrounding the outside of frame 430 is formed in the third mode of the measure for avoiding adhesion described above, it is possible to form independent recesses outside the four cutouts 440, and to retain heat dissipation grease 1100 that has flowed out from cutouts 440 into the recesses as pooling parts.

Additionally, a plurality of frames 430 may be provided by providing frame 430 on bottom surface 411 of recessed radiator base 410 and further providing one or more additional frames 430 in the periphery of radiator base 410 on a part that is a step higher.

Additionally, as heat dissipation grease 1100, a non-curing heat dissipation grease may be used.

Additionally, as cutout 440, a through hole connecting the inside and outside of frame 430 may be provided in wall 450.

Additionally, wall 450 is not limited to a straight shape, and by forming the center of wall 450 so as to protrude toward the inside of frame 430, the function of guiding heat dissipation grease 1100 toward cutout 440 can be improved.

REFERENCE SYMBOL LIST 100 electronic device
200 cover 300 substrate
320 microcomputer (element that produces heat)
400 base
410 radiator base (radiator member)
430 frame
440 cutout
441 storage part
450 wall
460 groove (pooling part)
500 case
1100 heat dissipation grease (heat conductive material)

The invention claimed is:

1. An electronic device comprising:
a substrate on which an element that produces heat is mounted, the element being rectangular;
a radiator member disposed at a position facing the element that produces heat;
a gap between the element that produces heat and the radiator member;
and a curable heat dissipation grease positioned in the gap between the element that produces heat and the radiator member, wherein:
the radiator member includes a rectangular frame that surrounds an arrangement region of the curable heat dissipation grease, the rectangular frame being formed in a wall shape protruding from a surface facing the element that produces heat in a position of the surface facing the element that produces heat outside a peripheral edge of the element that produces heat, and has a cutout in at least one of four corners of the rectangular frame, and
a pooling part of the curable heat dissipation grease having a lower bottom surface, which is lower than the arrangement region surrounded by the rectangular frame, is provided outside the cutout, and
wherein the radiator member includes an outer surface positioned outside of the arrangement region surrounded by the rectangular frame, wherein the surface facing the element that produces heat is lower than the outer surface.

2. The electronic device according to claim 1, wherein the pooling part is an annular groove surrounding an outside of the rectangular frame.

3. The electronic device according to claim 1, wherein the element that produces heat is a BGA package.

4. The electronic device according to claim 1, wherein a length of one side of the rectangular frame excluding the cutout is shorter than a length of one side of the element that produces heat facing the one side of the rectangular frame.

5. An electronic device comprising:
a substrate on which an element that produces heat, which is rectangular is mounted;
a radiator member disposed at a position facing the element that produces heat;
and a curable heat dissipation grease filling a gap between the element that produces heat and the radiator member, wherein:
the radiator member includes a radiator base of the element that produces heat that forms a part of a case of the substrate and is formed in a region facing the element that produces heat;
the radiator base includes a rectangular frame that surrounds an arrangement region of the curable heat dissipation grease in a position of a surface facing the element that produces heat outside a peripheral edge of the element that produces heat, has a cutout in at least one of four corners of the rectangular frame, and has, outside the cutout, a storage part capable of storing the curable heat dissipation grease having flowed out of the arrangement region surrounded by the rectangular frame, and
a length of one side of the rectangular frame excluding the cutout is shorter than a length of one side of the element that produces heat facing the one side of the rectangular frame and
wherein the radiator member includes an outer surface positioned outside of the arrangement region, wherein the surface facing the element that produces heat is lower than the outer surface.

6. The electronic device according to claim 5, wherein the element that produces heat is a BGA package.

* * * * *